(12) United States Patent
Atsumi

(10) Patent No.: US 10,676,813 B2
(45) Date of Patent: Jun. 9, 2020

(54) DEPOSITION APPARATUS

(71) Applicant: CANON ANELVA CORPORATION, Kawasaki-shi, Kanagawa (JP)

(72) Inventor: Masahiro Atsumi, Fuchu (JP)

(73) Assignee: CANON ANELVA CORPORATION, Kawasaki-Shi, Kanagawa-Ken (JP)

( * ) Notice: Subject to any disclaimer, the term of this patent is extended or adjusted under 35 U.S.C. 154(b) by 577 days.

(21) Appl. No.: 15/211,233

(22) Filed: Jul. 15, 2016

(65) Prior Publication Data

US 2016/0326630 A1 Nov. 10, 2016

Related U.S. Application Data

(63) Continuation of application No. PCT/JP2014/005736, filed on Nov. 14, 2014.

(30) Foreign Application Priority Data

Mar. 18, 2014 (JP) .................. 2014-055570

(51) Int. Cl.
  *C23C 16/00* (2006.01)
  *H01L 21/326* (2006.01)
  (Continued)

(52) U.S. Cl.
  CPC .......... *C23C 14/325* (2013.01); *C23C 14/505* (2013.01); *C23C 14/54* (2013.01);
  (Continued)

(58) Field of Classification Search
  CPC .......... H01J 37/32055; H01J 37/32614; H01J 37/32944; H01J 37/34; H01J 37/3414;
  (Continued)

(56) References Cited

U.S. PATENT DOCUMENTS 5,846,328 A 12/1998 Aruga et al.
6,027,618 A 2/2000 Aruga et al.
(Continued)

FOREIGN PATENT DOCUMENTS

CN 101405428 A 4/2009
JP 5-17866 A 1/1993
(Continued)

OTHER PUBLICATIONS

International Search Report (PCT/ISA/210) dated Feb. 17, 2015, by the Japanese Patent Office as the International Searching Authority for International Application No. PCT/JP2014/005736.
(Continued)

*Primary Examiner* — Luz L Alejandro Mulero
(74) *Attorney, Agent, or Firm* — Buchanan Ingersoll & Rooney PC

(57) ABSTRACT

This invention provides a deposition apparatus which forms a film on a substrate, comprising: a rotation unit configured to rotate a target about a rotating axis; a striker configured to generate an arc discharge; a driving unit configured to drive the striker so as to make a close state which the striker closes to a side surface around the rotating axis of the target to generate the arc discharge; and a control unit configured to control rotation of the target by the rotation unit so as to change a facing position on the side surface of the target facing the striker in the close state.

8 Claims, 9 Drawing Sheets

(51) Int. Cl.
*C23C 14/32* (2006.01)
*G11B 5/84* (2006.01)
*C23C 14/56* (2006.01)
*H01J 37/32* (2006.01)
*H01J 37/34* (2006.01)
*C23C 14/50* (2006.01)
*C23C 14/54* (2006.01)

(52) U.S. Cl.
CPC .......... C23C 14/568 (2013.01); G11B 5/8408 (2013.01); H01J 37/32055 (2013.01); H01J 37/32064 (2013.01); H01J 37/32614 (2013.01); H01J 37/32944 (2013.01); H01J 37/34 (2013.01); H01J 37/3417 (2013.01)

(58) Field of Classification Search
CPC .. H01J 37/3417; H01J 37/32064; H01J 37/30; H05H 2001/4695; H05H 2001/481; H05H 2001/483; H05H 2001/485; H05H 2001/486; H05H 2001/488; H05H 1/48; H05H 1/52
See application file for complete search history.

(56) References Cited

U.S. PATENT DOCUMENTS

| | | | |
|---|---|---|---|
| 8,133,365 | B2 | 3/2012 | Fujii |
| 8,663,441 | B2 | 3/2014 | Wu et al. |
| 2005/0031797 | A1* | 2/2005 | Matsuyama ...... H01J 37/32623 427/569 |
| 2005/0045472 | A1* | 3/2005 | Nagata ............. H01J 37/32055 204/192.38 |
| 2009/0065348 | A1* | 3/2009 | Fujii .................... C23C 14/325 204/192.11 |
| 2010/0213054 | A1* | 8/2010 | Wu ....................... C23C 14/325 204/298.41 |
| 2011/0109227 | A1* | 5/2011 | Shiina ................. C23C 14/325 315/111.21 |

FOREIGN PATENT DOCUMENTS

| | | |
|---|---|---|
| JP | 8-274142 | 10/1996 |
| JP | 11-350115 A | 12/1999 |
| JP | 2004-169132 A | 6/2004 |
| JP | 2008-050653 | 3/2008 |
| JP | 2009-242929 | 10/2009 |
| TW | 201031766 | 9/2010 |
| WO | WO 96/26531 | 8/1996 |
| WO | WO 2013/099058 A1 | 7/2013 |

OTHER PUBLICATIONS

Written Opinion (PCT/ISA/237) dated Feb. 17, 2015, by the Japanese Patent Office as the International Searching Authority for International Application No. PCT/JP2014/005736.

Taiwanese Office Action dated Apr. 19, 2016 and Search Report dated Apr. 18, 2016, issued by the Taiwanese Patent Office in the corresponding Taiwanese Patent Application No. 104101179. (10 pages)(with English Translation).

Office Action (Notification of the First Office Action) dated Jan. 24, 2018, by the Chinese Patent Office in corresponding Chinese Patent Application No. 201480075404.5, and an English Translation of the Office Action. (17 pages).

\* cited by examiner

DEPOSITION APPARATUS

This application is a continuation of International Patent Application No. PCT/JP2014/005736 filed on Nov. 14, 2014, and claims priority to Japanese Patent Application No. 2014-055570 filed on Mar. 18, 2014, the entire content of both of which is incorporated herein by reference.

TECHNICAL FIELD

The present invention relates to a deposition apparatus which forms a film on a substrate.

BACKGROUND ART

As a method of forming a protection film for a medium such as a hard disk, there is a CVD (Chemical Vapor Deposition) method using a reactive gas such as acetylene ($C_2H_2$) or ethylene ($C_2H_4$). Recently, a thinner protection film of carbon or the like (carbon protection film) formed on a magnetic recording layer is required to further shorten the head flying height and the spacing distance between a magnetic read head and the magnetic recording layer of a medium, and improve the drive characteristic.

On the other hand, the limitation of the thickness of the carbon protection film formed by CVD is said to be 2 to 3 nm owing to its characteristic. As a technique replacing CVD, attention has been paid to a deposition method (vacuum arc deposition) which uses an arc discharge and can form a thinner carbon protection film (see PTL 1 and PTL 2). Vacuum arc deposition can form a harder carbon protection film with a lower hydrogen content in comparison with CVD, and has the possibility of decreasing the film thickness to about 1 nm.

In the vacuum arc deposition disclosed in PTL 1, carbon ions required for a ta-C film are generated by setting a target made of graphite as the cathode, and generating an arc discharge between the target and the anode arranged near the target. The arc discharge is generated by bringing a striker connected to the anode closer to or into contact with the target.

In such vacuum arc deposition, an arc discharge is generally generated by using a columnar target and bringing a striker into contact with the vicinity of the center portion of the upper surface of the target. A position with which the upper surface of the target has come into contact (a position where the arc discharge has been generated) is shaved to be a dent (arc spot). Therefore, unevenness of the target caused by the arc spot is averaged by rotating the target to change the contact position with the striker. Note that when the columnar target is used, a deposition rate varies if an arc spot is generated in the peripheral portion of the upper surface of the target. It is therefore preferable that the arc spot is generated only in the center portion of the upper surface of the target. However, the peripheral portion of the upper surface of the target remains without being shaved unless the arc spot is generated in the peripheral portion of the upper surface of the target. To cope with this, PTL 2 has proposed a technique of planarizing the upper surface of a target by shaving it with a grinder or the like when an arc spot (dent) on the upper surface of the target becomes large to some extent.

CITATION LIST

Patent Literature

PTL 1: International Publication No. 96/26531 Pamphlet
PTL 2: Japanese Patent Laid-Open No. 2009-242929

SUMMARY OF INVENTION

Technical Problem

However, shaving the upper surface of a target results in removing a portion available as a target. Therefore, this prevents an improvement in the utilization efficiency of the target. Further, in the conventional technique, a step of shaving the upper surface of the target needs to be inserted in a deposition process, causing a decrease in throughput. Furthermore, shaving chips of the target may enter into a rotating apparatus (a driving unit thereof) which rotates the target, causing a malfunction in the rotating apparatus.

The present invention provides a deposition apparatus advantageous in improving the utilization efficiency of the target without shaving the target.

Solution to Problem

According to one aspect of the present invention, there is provided a deposition apparatus which forms a film on a substrate, including a rotation unit configured to rotate a target about a rotating axis, a striker configured to generate an arc discharge, a driving unit configured to drive the striker so as to make a close state which the striker closes to a side surface around the rotating axis of the target to generate the arc discharge, and a control unit configured to control rotation of the target by the rotation unit so as to change a facing position on the side surface of the target facing the striker in the close state.

Further objects or other aspects of the present invention will become apparent by a preferred embodiment to be described below with reference the accompanying drawings.

Advantageous Effects of Invention

According to the present invention, for example, it is possible to provide a deposition apparatus advantageous in improving the utilization efficiency of a target without shaving the target.

DESCRIPTION OF EMBODIMENTS

Figure 1:
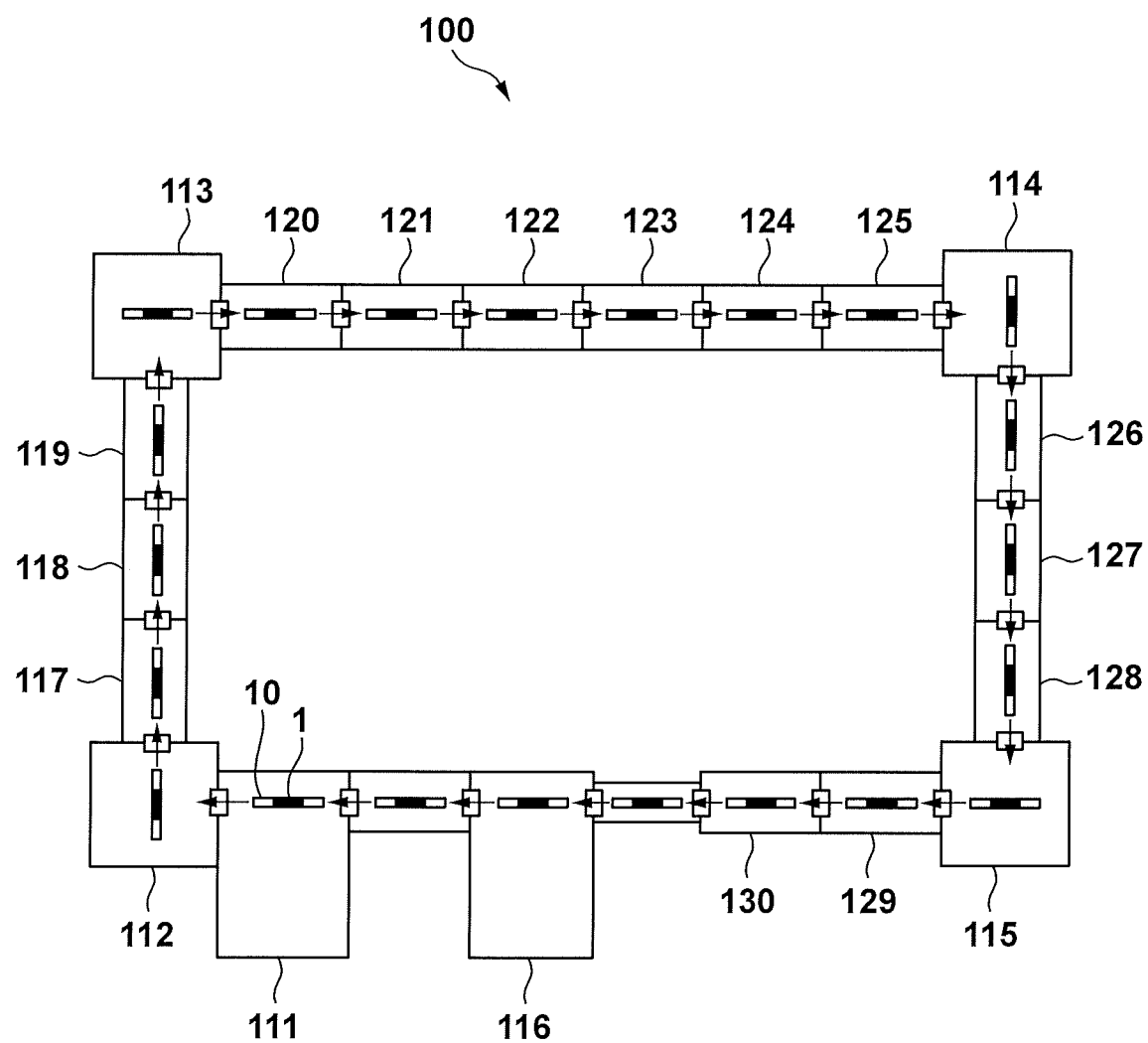
FIG. 1 is a schematic plan view showing the arrangement of a processing apparatus according to an aspect of the present invention.

A preferred embodiment of the present invention will be described below with reference to the accompanying drawings. Note that the same reference numerals denote the same members throughout the drawings, and a repetitive description thereof will be omitted.

FIG. 1 is a schematic plan view showing the arrangement of a processing apparatus 100 according to an aspect of the present invention. The processing apparatus 100 is a vacuum processing apparatus (deposition apparatus) which forms a film on a substrate used for a medium such as a hard disk. In this embodiment, the processing apparatus 100 is configured as an in-line apparatus. An in-line scheme is a method of processing a substrate while conveying the substrate via a plurality of coupled chambers. In FIG. 1, a plurality of chambers 111 to 130 are coupled endlessly so as to form a rectangular layout. Each of the chambers 111 to 130 includes an evacuation apparatus which evacuates the chamber.

In the processing apparatus 100, the adjacent chambers are coupled via gate valves. In each of the chambers 111 to 130, a conveying apparatus which conveys a carrier 10 holding a substrate 1 via the gate valve is arranged. The conveying apparatus includes a conveyance path which conveys the carrier 10 at a vertical position. The substrate 1 is held by the carrier 10 and conveyed along the conveyance path. The substrate 1 is a disc-shaped member having a hole (inner circumferential hole) in a center portion and made of a metal or glass. A magnetic layer, a protection layer, or the like is formed on each of the two sides, that is, the front side and the back side of the substrate 1.

The chambers 111 to 130 include process chambers which perform various processes. Out of the chambers 111 to 130, for example, the chamber 111 is a load lock chamber where a process of attaching the substrate 1 to the carrier 10 is performed and the chamber 116 is an unload lock chamber where a process of removing the substrate 1 from the carrier 10 is performed. Each of the chambers 112, 113, 114, and 115 includes a direction changing apparatus which changes the conveyance direction of the carrier 10 (substrate 1) by 90°. The chamber 117 is an adhesion layer formation chamber which forms an adhesion layer on the substrate 1. Each of the chambers 118, 119, and 120 is a soft magnetic layer formation chamber which forms a soft magnetic layer on the substrate 1 where the adhesion layer has been formed. The chamber 121 is a seed layer formation chamber which forms a seed layer on the substrate 1 where the soft magnetic layer has been formed. Each of the chambers 123 and 124 is an intermediate layer formation chamber which forms an intermediate layer on the substrate 1 where the seed layer has been formed. Each of the chambers 126 and 127 is a magnetic film formation chamber which forms a magnetic film on the substrate 1 where the intermediate layer has been formed. The chamber 129 is a protection film formation chamber which forms a protection film on the substrate 1 where the magnetic film has been formed.

An example of the processing procedure of the substrate 1 in the processing apparatus 100 will be described. First, in the chamber 111, two unprocessed substrates 1 are attached to the first carrier 10. The carrier 10 moves to the chamber 117 for forming the adhesion layer to form the adhesion layer on the substrate 1. During this time, in the chamber 111, two unprocessed substrates 1 are attached to the second carrier 10.

Next, the soft magnetic layer is formed on the substrate 1 while the first carrier 10 sequentially moves to the chambers 118, 119, and 120 for forming the soft magnetic layer. During this time, the second carrier 10 moves to the chamber 117 for forming the adhesion layer to form the adhesion layer on the substrate 1. Further, in the chamber 111, the substrate 1 is attached to the third carrier 10. As described above, each time the first carrier 10 and the following carrier 10 move, the substrate 1 is attached to the subsequent carrier 10 in the chamber 111.

Next, the first carrier 10 which holds the substrate 1 where the soft magnetic layer has been formed moves to the chamber 121 for forming the seed layer to form the seed layer on the substrate 1. Then, the first carrier 10 sequentially moves to the chambers 123 and 124 for forming the intermediate layer, the chambers 126 and 127 for forming the magnetic film, and the chamber 129 for forming the protection film to form the intermediate layer, the magnetic film, and the protection film on the substrate 1.

Figure 2A:
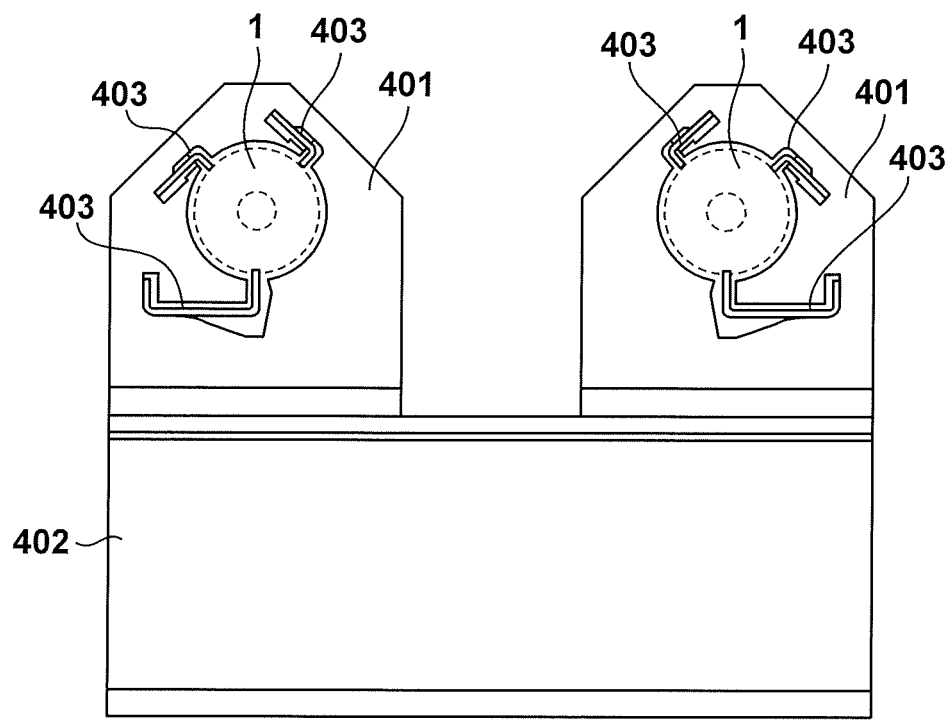
FIG. 2A is a schematic view showing the arrangement of a carrier in the processing apparatus shown in FIG. 1.
Figure 2B:
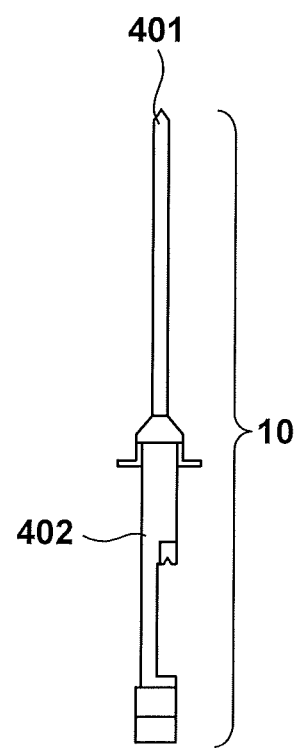
FIG. 2B is a schematic view showing the arrangement of the carrier in the processing apparatus shown in FIG. 1.

Each of FIGS. 2A and 2B is a schematic view showing the arrangement of the carrier 10. FIG. 2A is a front view of the carrier 10. FIG. 2B is a side view of the carrier 10. In this embodiment, the carrier 10 holds two substrates 1 at the same time and, as described above, moves on the conveyance path at the vertical position. The carrier 10 includes holders 401 which hold the substrates 1 and made of an Ni alloy and a slider 402 which moves on the conveyance path while supporting the holders 401. By holding the peripheral portion of each substrate 1 with a plurality of elastic members (leaf springs) 403 provided in the holder 401, the carrier 10 holds the substrate 1 at a position facing the target without shielding the front side and the back side (deposition surfaces) of the substrates 1.

The conveying apparatus arranged in each chamber of the processing apparatus 100 includes a number of driven rollers arranged along the conveyance path and a magnetic screw for introducing power to a vacuum side by a magnetic coupling scheme. The conveying apparatus moves the carrier 10 along the driven roller by magnetically coupling a permanent magnet provided in the slider 402 of the carrier 10 and the magnetic screw of the conveying apparatus. Note that any arrangement well known in the art can be applied to the conveying apparatus or the carrier 10. For example, an arrangement disclosed in Japanese Patent Laid-Open No. 8-274142 can be applied to the conveying apparatus or the carrier 10. The conveying apparatus may use a linear motor or a rack and pinion mechanism.

The chamber 129 for forming the protection film on the substrates 1 includes a voltage application unit configured to change the potential of the substrates 1 (apply a voltage to the substrate 1). Each substrate 1 held in the carrier 10 is electrically connected to the holder 401 via the conductive elastic member 403. It is therefore possible to change the potential of the substrate 1 by changing the potential of the elastic member 403. The voltage application unit includes, for example, an apparatus which brings an electrode connected to a power supply (a DC power supply, a pulse power supply, a high-frequency power supply, or the like) or ground into contact with the holder 401.

Figure 3:
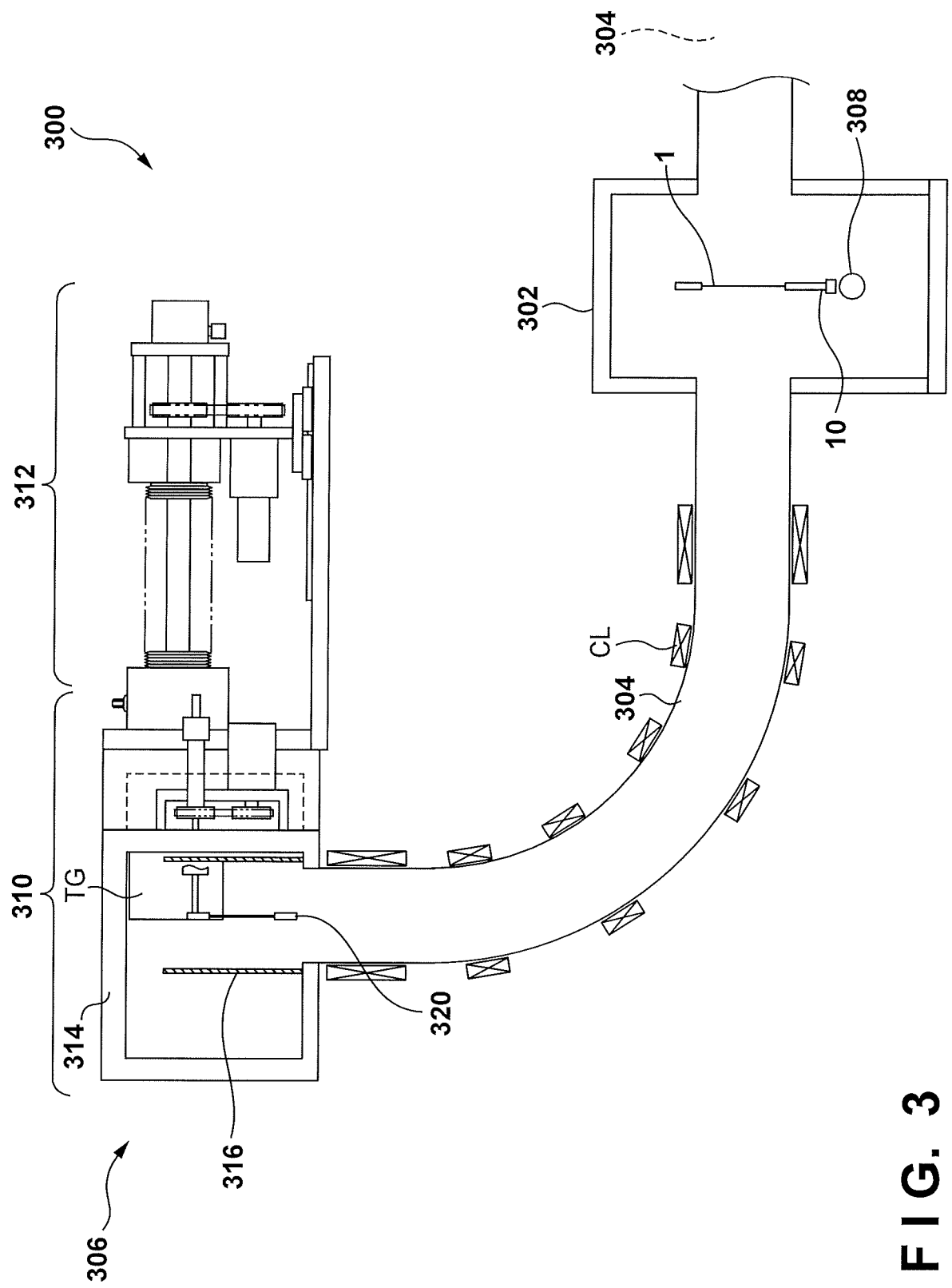
FIG. 3 is a schematic view showing an example of the arrangement of a deposition apparatus.

FIG. 3 is a schematic view showing an example of the arrangement of a deposition apparatus 300. The deposition apparatus 300 corresponds to, for example, the chamber 119 out of the chambers 117 to 130 (except for the chambers 112 to 114) which form the processing apparatus 100 shown in FIG. 1. In this embodiment, the deposition apparatus 300 is embodied as a ta-C deposition apparatus which forms a protection film made of a ta-C layer on the surface of the magnetic film formed on the substrate 1. The deposition apparatus 300 includes a process chamber (vacuum chamber) 302, a filter unit 304, and a source unit 306. FIG. 3 only shows a set of the filter unit 304 and the source unit 306. In practice, however, on either side of the process chamber 302, one set of the filter unit 304 and the source unit 306 (that is, two sets of the filter units 304 and the source units 306) is provided. Note that when a carrier which supports two substrates is used, four sets of the filter units 304 and the source units 306 may be used so that the both sides of the two substrates can be processed at the same time.

The process chamber 302 includes a conveying apparatus 308 configured to position the substrate 1 at a predetermined position (deposition position) in the vertical state inside the process chamber 302. The filter units 304 are connected to both sides of the process chamber 302 (more specifically, the deposition position). Further, the process chamber 302 is connected to an evacuation apparatus which evacuates it.

The filter unit 304 is made of a curved tube member. One end of the filter unit 304 is connected to the process chamber 302 and the other end is connected to the source unit 306. Coils CL each serving as an electromagnet which generates a magnetic field for guiding carbon ions to a substrate side are provided around the filter unit 304.

The source unit 306 includes an ion generation unit 310 and a target driving unit 312. The ion generation unit 310 includes a chamber 314 inside of which communicates with the filter unit 304, an anode 316, a target holder 318 which holds (places) a target TG, and a striker 320. The striker 320 is a member for generating an arc discharge (that is, striking a discharge) between the target TG and the anode 316. The target driving unit 312 includes rotation unit (rotation driving unit) 322 and a moving unit (back-and-forth driving unit) 324.

In this embodiment, the target TG is made of carbon (graphite) and generates carbon ions by an arc discharge. In this embodiment, the target TG has a columnar shape. However, the target TG may have another shape such as a prismatic shape, a cylindrical shape, or a rectangular tube shape. The rotation unit 322 rotates the target TG about a rotating axis RA in a state in which the target TG is supported in the horizontal direction while matching the rotating axis RA and the central axis of the target TG having the columnar shape. The moving unit 324 moves (forward and backward) the target TG along the rotating axis RA (the central axis of the target TG).

Figure 4:
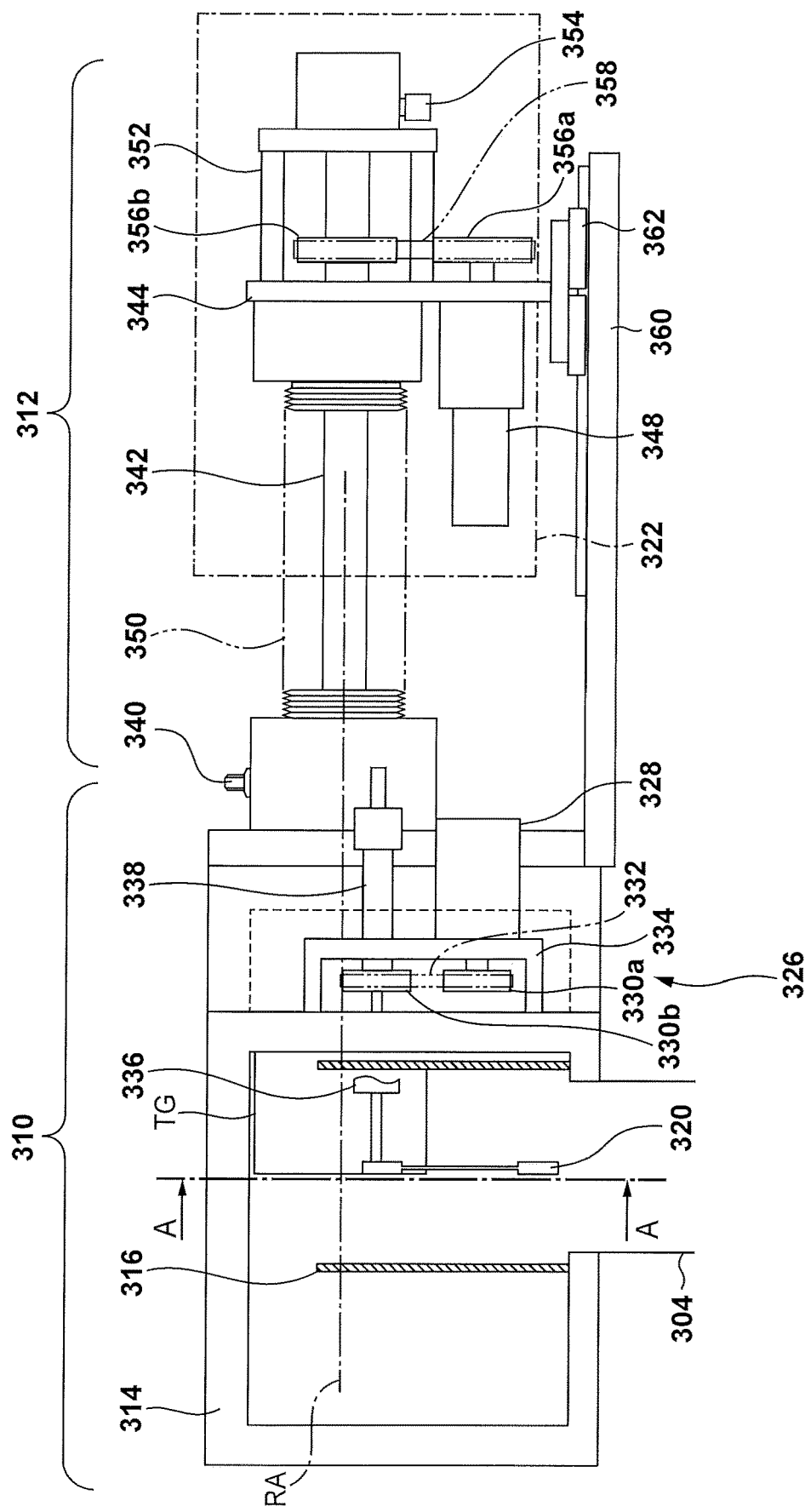
FIG. 4 is an enlarged front view showing a source unit of the deposition apparatus shown in FIG. 3.
Figure 5:
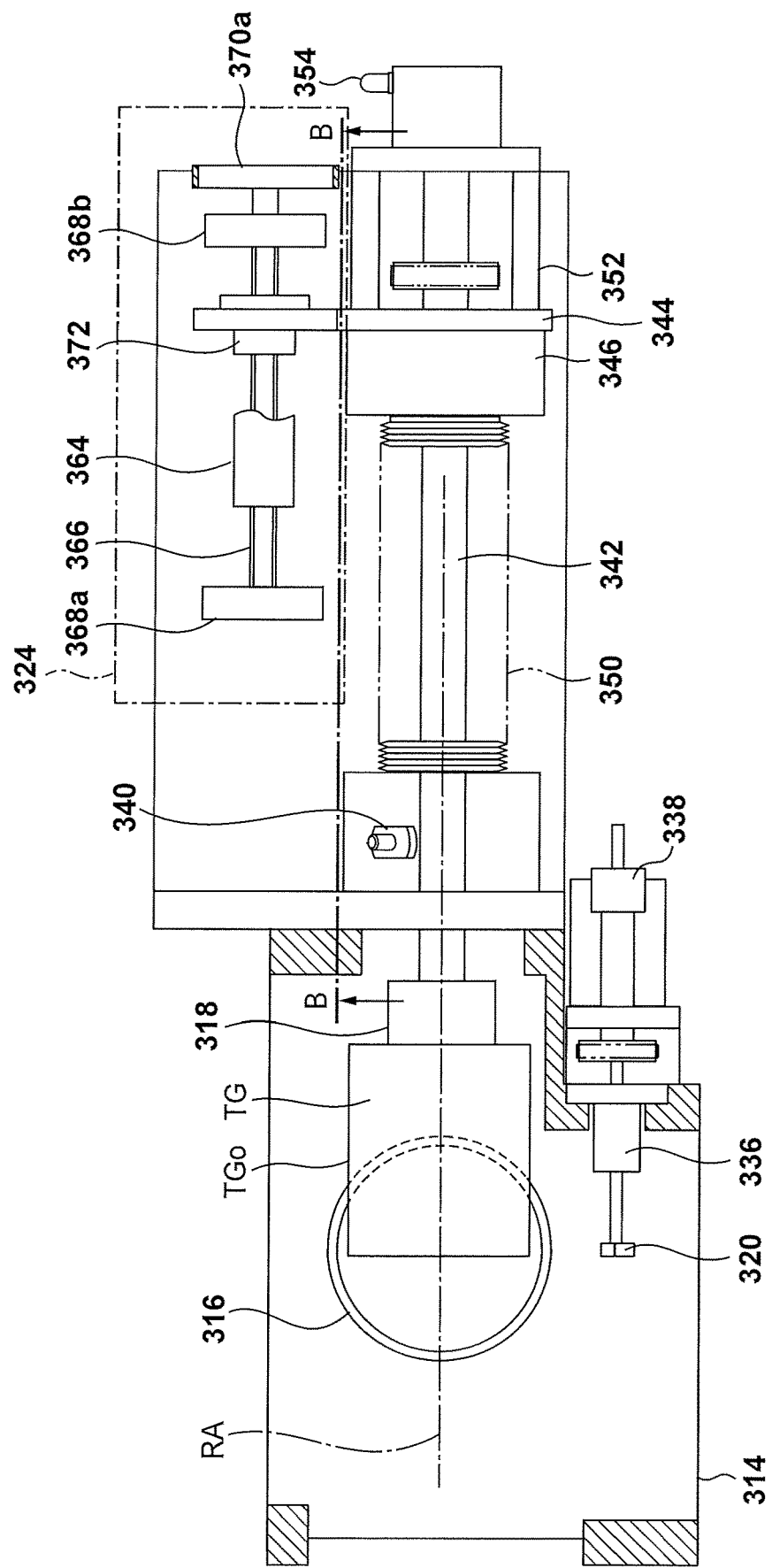
FIG. 5 is an enlarged top view showing the source unit of the deposition apparatus shown in FIG. 3.
Figure 6:
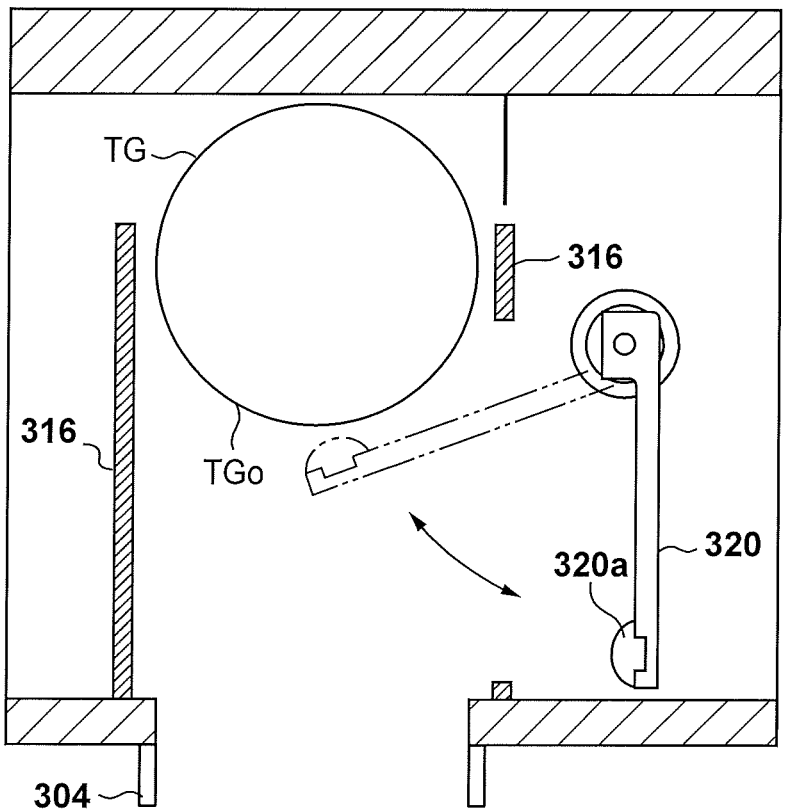
FIG. 6 is a view taken along a line A-A of the source unit shown in FIG. 4.
Figure 7:
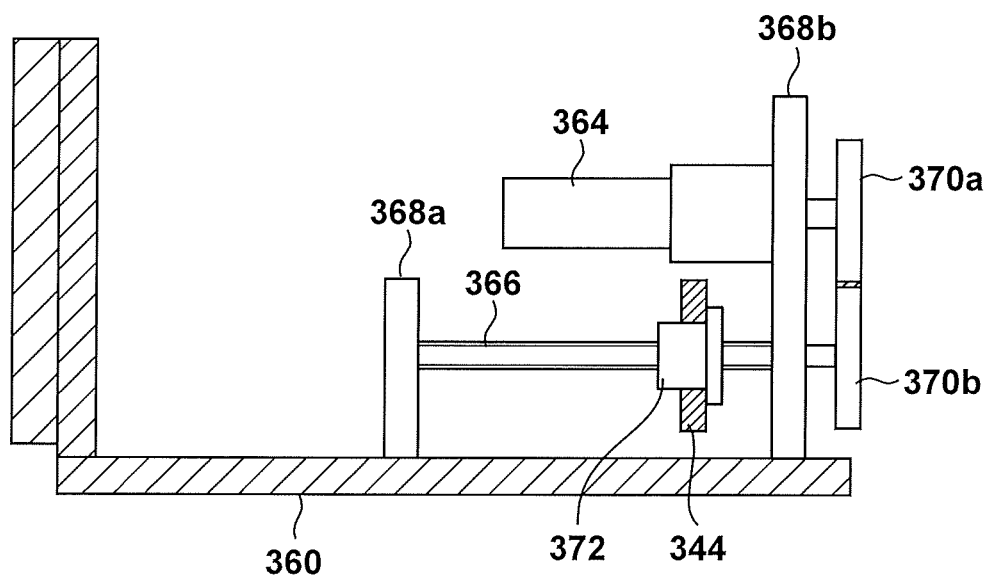
FIG. 7 is a view taken along a line B-B of the source unit shown in FIG. 5.

The arrangement of the deposition apparatus 300 will be described in detail with reference to FIGS. 4 to 7. FIG. 4 is an enlarged front view of the source unit 306. FIG. 5 is an enlarged top view of the source unit 306. FIG. 6 is a view taken along a line A-A of the source unit 306 shown in FIG. 4. FIG. 7 is a view taken along a line B-B of the source unit 306 shown in FIG. 5.

The chamber 314 which can be evacuated accommodates the target TG and its peripheral units, that is, the target TG, the anode 316, and the striker 320. The anode 316 is a cylindrical member for maintaining an arc discharge generated by bringing the striker 320 closer to or into contact with the target TG and is arranged so as to surround a portion in which the arc discharge is generated.

The striker 320 generates the arc discharge by moving closer to or contacting the target TG. The striker 320 is electrically connected to the anode 316 and is provided such that it can contact an outer surface $TG_o$ of the target TG. Note that the outer surface $TG_o$ of the target TG is a side surface around the rotating axis RA (around the rotating axis) of the target TG. The fact that the striker 320 can contact the outer surface $TG_o$ of the target TG means that not only the striker 320 physically contacts the outer surface $TG_o$ but also the striker 320 moves closer to and electrically contacts the outer surface $TG_o$. In other words, it also means that the striker 320 and the target TG are electrically conducted to each other with a low resistance.

As shown in FIG. 6, a striker driving unit 326 drives the striker 320 so as to obtain a close state in which the outer surface $TG_o$ of the target TG and the striker 320 (a front end 320a thereof) are close to each other or a separating state in which the outer surface $TG_o$ and the striker 320 are separated from each other. As shown in FIG. 4, the striker driving unit 326 includes, for example, a striker motor 328, pulleys 330a and 330b, a belt 332, a motor base 334, and a magnetic seal 336. The striker 320 is connected to the striker motor 328 via the pulleys 330a and 330b, and the belt 332. The striker motor 328 is fixed to the motor base 334 provided in the chamber 314 and rotates the striker 320 by about 90°. Since the striker motor 328 is provided on an atmospheric side, the striker driving unit 326 introduces a rotating force to the striker 320 on a vacuum side from the atmospheric side. In this embodiment, power is introduced via a rotary connector (rotation introduction unit) 338 in order to introduce a current with stability regardless of the rotation angle of the striker 320.

The target TG is held by the target holder 318. A target feeding terminal 340 is provided on the atmospheric side such that the current can be supplied to the target TG via the target holder 318.

The target holder 318 is fixed to one end of a shaft 342. The rotation unit 322 is provided in the other end of the shaft 342. The moving unit 324 is provided so as to move (forward and backward) a base plate 344 which supports the rotation unit 322. The shaft 342 is a member which supports the target TG horizontally and a part of a path for supplying the current to the target TG. A water channel for supplying cooling water for cooling the target TG is formed inside the shaft 342. The target holder 318 is provided between the shaft 342 and the target TG, functioning to fix and cool the target TG, and to serve as a current path.

The rotation unit 322 will be described. The base plate 344 includes a rotating seal unit 346 of the shaft 342. A rotation motor 348 is fixed to the base plate 344 on the atmospheric side.

A bellows 350 is provided between the chamber 314 and the base plate 344, and includes the shaft 342 arranged inside. Inside of the bellows 350 can communicate with the chamber 314 and be maintained under vacuum. The bellows 350 extends or contracts in accordance with movement of the base plate 344.

A column 352 is a member which fixes a coupling 354 for supplying cooling water to the water channel formed inside the shaft 342 and draining the cooling water from the water channel. The rotation motor 348 rotates the shaft 342 via pulleys 356a and 356b, and a belt 358.

The moving unit 324 will be described. A mounting base 360 is a member fixed to the chamber 314. The base plate 344 is fixed to the mounting base 360 via an LM guide 362. The LM guide 362 is provided so as to move the base plate 344 along the rotating axis RA of the rotation unit 322 (the central axis of the target TG).

As shown in FIG. 7, a movement motor 364 and a ball screw 366 are fixed to the mounting base 360. A first plate 368a and a second plate 368b are members supporting the ball screw 366. The movement motor 364 is fixed to the second plate 368b, and rotates the ball screw 366 via gears 370a and 370b. The base plate 344 is fixed to a nut 372 which moves (forward and backward) in accordance with rotation of the ball screw 366. It is therefore possible to move a portion attached to the base plate 344 by rotating the movement motor 364. As described above, one end of each of the shaft 342 and the bellows 350 is attached to the base plate 344.

Figure 8:
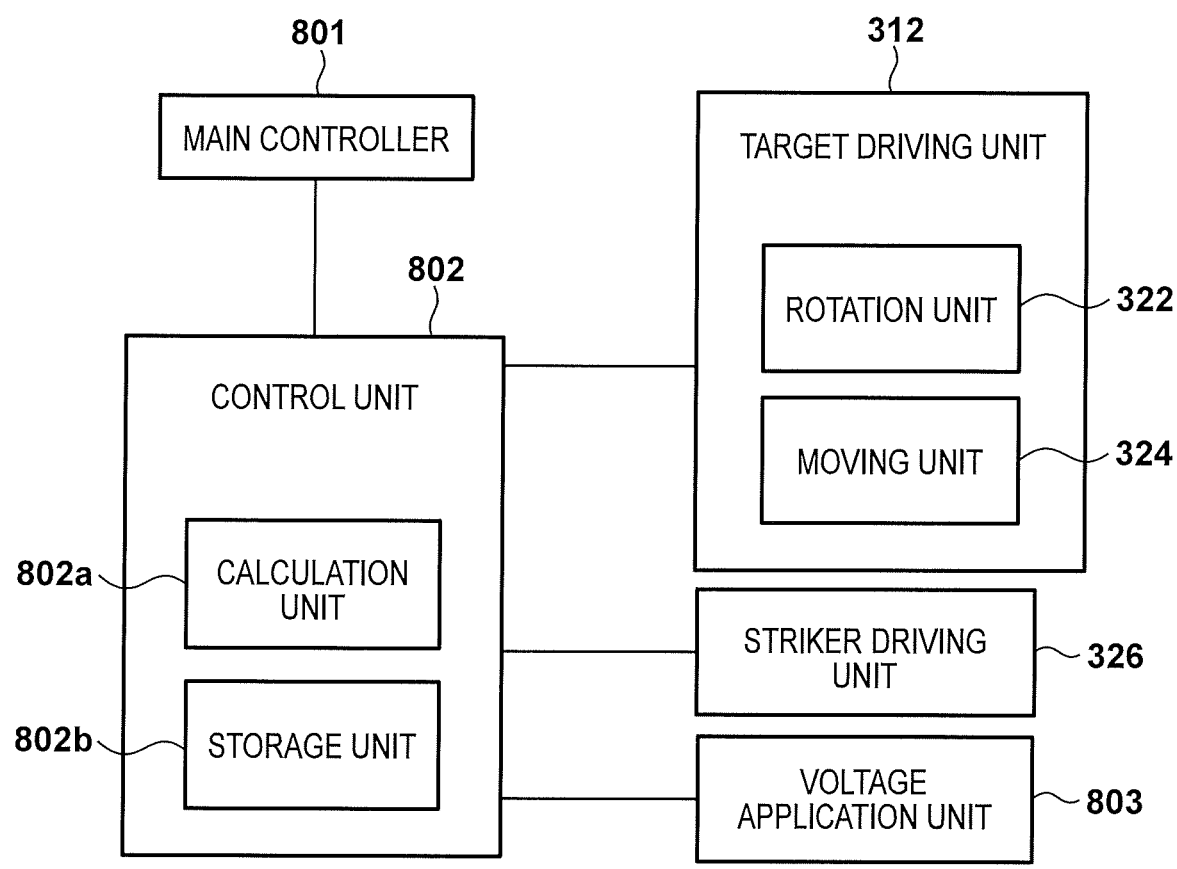
FIG. 8 is a block diagram showing the arrangement of a system for control of an operation of the deposition apparatus shown in FIG. 3.

FIG. 8 is a block diagram showing the arrangement of a system for control of an operation of the deposition apparatus 300, that is, a process of forming a film by irradiating the substrate 1 with ions generated from the target TG by an arc discharge. In control of the process, a command (control signal) from a host main controller 801 is transmitted to the respective units of the deposition apparatus 300 via a control unit 802.

The control signal from the main controller 801 is input to the control unit 802 which includes a calculation unit 802a formed by a CPU or the like and a storage unit 802b formed by a memory or the like. The control unit 802 transmits the input control signal to the target driving unit 312, the striker driving unit 326, and a voltage application unit 803. The control unit 802 receives the signal from the target driving unit 312, the striker driving unit 326, and the voltage application unit 803, and transmits it to the main controller 801.

The main controller 801 has a function of controlling the overall processing apparatus 100. The main controller 801 controls, for example, a substrate conveying system such as a conveying apparatus, a gate valve, and a conveying robot, and a control system of another process chamber.

The calculation unit 802a performs arithmetic processing on the signal from the target driving unit 312, the striker driving unit 326, and the voltage application unit 803, obtaining a current value and a change amount. The storage unit 802b stores, for example, the current value, the change amount, and the control order of the target driving unit 312, the striker driving unit 326, and the voltage application unit 803. In addition, the storage unit 802b returns, in accordance with a signal read out from the calculation unit 802a, stored values (for example, the current values and the change amounts of the target driving unit 312, the striker driving unit 326, and the voltage application unit 803).

As described above, the target driving unit 312 includes the rotation unit 322 and the moving unit 324, and rotates the target TG or moves (forward and backward) the target TG. As described above, the striker driving unit 326 drives the striker 320 so as to obtain the close state in which the outer surface $TG_o$ of the target TG and the striker 320 are close to each other or the separating state in which the outer surface $TG_o$ and the striker 320 are separated from each other.

Each of the target driving unit 312 and the striker driving unit 326 includes a motor with a sensor which detects the rotation angle of an encoder or the like. In other words, each of the target driving unit 312 and the striker driving unit 326 is configured as a driving source that can control the rotation angle.

The voltage application unit 803 supplies a voltage (power) for generating an arc discharge between the target TG and the anode 316. The voltage application unit 803 is configured as, for example, a power supply. However, the voltage application unit 803 may include a sensor such as a resistance meter.

The striker driving unit 326 drives the striker 320 in accordance with the control signal from the control unit 802 after the target driving unit 312 completes driving the target TG. After the striker driving unit 326 completes driving the striker 320 (that is, after the close state is obtained in which the outer surface $TG_o$ of the target TG and the striker 320 are close to each other), the voltage application unit 803 applies the voltage. Whether the target TG and the striker 320 are in the close state is determined by, for example, the fact that the rotation speed of the striker motor 328 that drives (rotates) the striker 320 is 0. Such a determination may be made by an elapsed time from the start of rotating the striker motor 328, a state of an electrical resistance between the target TG and the striker 320, or an increase in a torque.

The voltage application unit 803 may apply the voltage until the close state in which the striker 320 is closer to (contacts) the target TG changes to the separating state. More specifically, the close state in which the striker 320 is closer to the target TG is maintained for a predetermined time and the voltage application unit 803 continues to apply the voltage for the predetermined time. Then, after the voltage application unit 803 applies the voltage, the striker driving unit 326 retracts the striker 320, obtaining the separating state in which the target TG and the striker 320 are separated from each other. An arc discharge can be generated with stability by performing such control. Note that the target TG is rotated by a predetermined angle by the rotation unit 322 and is moved (forward and backward) by a predetermined distance by the moving unit 324 after the completion of the arc discharge.

The deposition apparatus 300 supports the target TG in a state in which the central axis of the target TG having the columnar shape is on a horizontal line and generates an arc discharge on the outer surface $TG_o$ of the target TG. The target driving unit 312 can rotate and move the target TG, making it possible to generate the arc discharge at any position on the outer surface $TG_o$ of the target TG.

An arc discharge is generated at a position where the target TG and the striker 320 contact each other. In this embodiment, that position is a facing position on the outer surface $TG_o$ of the target TG facing the striker 320 in the close state in which the target TG and the striker 320 are close to each other. At this time, a portion (facing position) where the arc discharge has been generated out of the outer surface $TG_o$ of the target TG is shaved.

To cope with this, in the deposition apparatus 300 of this embodiment, the target TG is driven such that a portion of the outer surface $TG_o$ of the target TG to be shaved by the succeeding arc discharge is brought closer to or is overlaid on the portion shaved by the preceding arc discharge. Consequently, the target TG is shaved evenly, making it possible to generate an arc discharge with stability while improving the utilization efficiency of the target TG without removing (shaving) a portion available as a target. It is also possible to suppress a decrease in throughput and occurrence of a malfunction in the target driving unit 312 or the striker driving unit 326 caused by the shaving chips of the target TG because a step of shaving the target TG need not be inserted in a deposition process in the deposition apparatus 300.

Control of the facing position (a position where the arc discharge is generated) on the outer surface $TG_o$ of the target TG facing the striker 320 in the close state in which the target TG and the striker 320 are close to each other will be described with reference to FIGS. 9A to 9E. The control is performed by causing the control unit 802 to comprehensively control the target driving unit 312 and the striker driving unit 326.

Figure 9A:
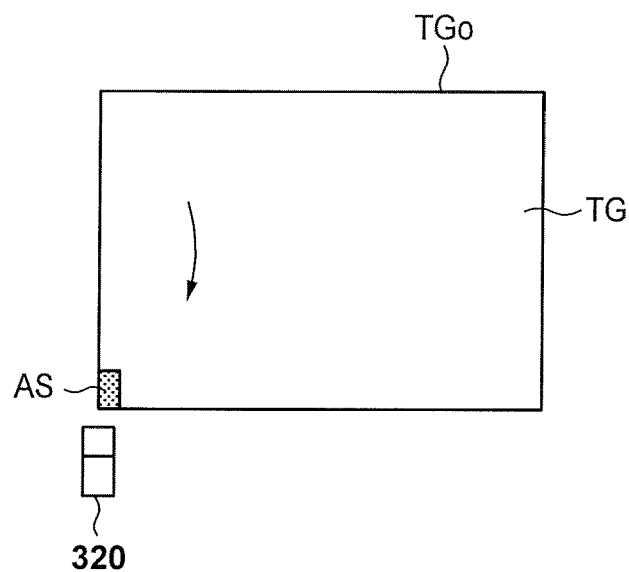
FIG. 9A is a view for explaining control of a position where an arc discharge is generated in the deposition apparatus shown in FIG. 3.

First, as shown in FIG. 9A, the target driving unit 312 drives the target TG such that the target TG and the striker 320 are in the close state in the upper end of the outer surface $TG_o$ of the target TG. Then, the striker 320 is driven by the striker driving unit 326 and moved closer to the outer surface $TG_o$ of the target TG, thereby generating an arc discharge. Consequently, an arc spot AS is generated at the facing position on the outer surface $TG_o$ of the target TG facing the striker 320. After the completion of the arc discharge, the striker driving unit 326 drives the striker 320, setting the striker 320 and the outer surface $TG_o$ of the target TG in the separating state.

Figure 9B:
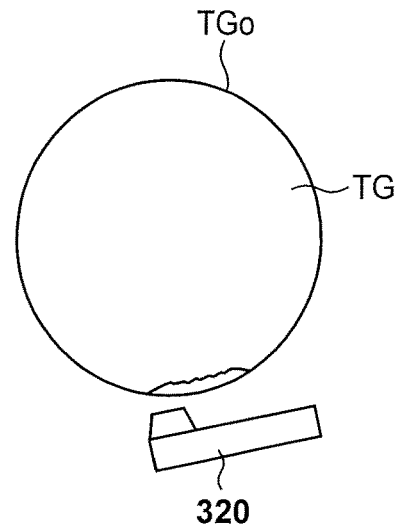
FIG. 9B is a view for explaining control of the position where the arc discharge is generated in the deposition apparatus shown in FIG. 3.
Figure 9C:
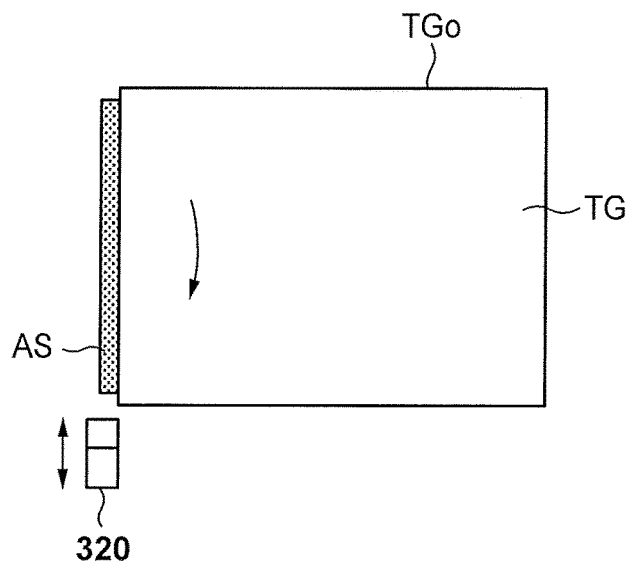
FIG. 9C is a view for explaining control of the position where the arc discharge is generated in the deposition apparatus shown in FIG. 3.

Next, as shown in FIG. 9B, the target driving unit 312 (rotation unit 322) rotates the target TG about the rotating axis RA such that the arc spot AS generated in the target TG by the arc discharge is adjacent or a part thereof overlaps. Then, the striker 320 is driven by the striker driving unit 326 and moved closer to the outer surface $TG_o$ of the target TG, thereby generating an arc discharge. After the completion of the arc discharge, the striker driving unit 326 drives the striker 320, setting the striker 320 and the outer surface $TG_o$ of the target TG in the separating state. By repeating the arc discharges and rotation of the target TG in this manner, the arc spot AS is generated circumferentially on the outer surface $TG_o$ of the target TG as shown in FIG. 9C.

Figure 9D:
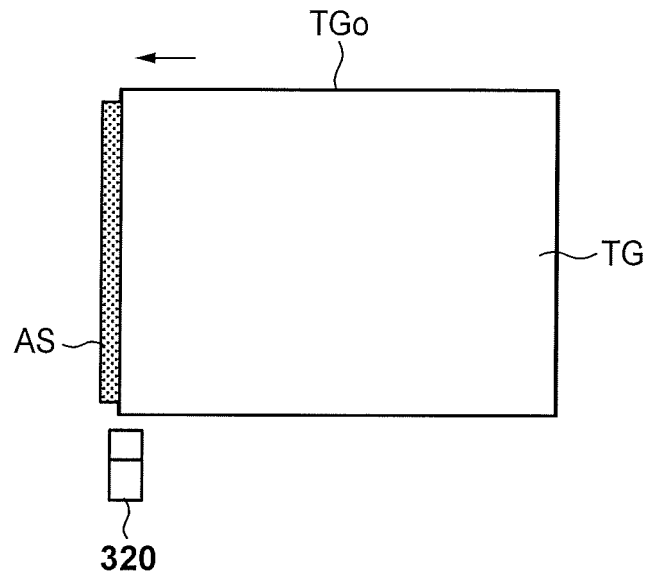
FIG. 9D is a view for explaining control of the position where the arc discharge is generated in the deposition apparatus shown in FIG. 3.
Figure 9E:
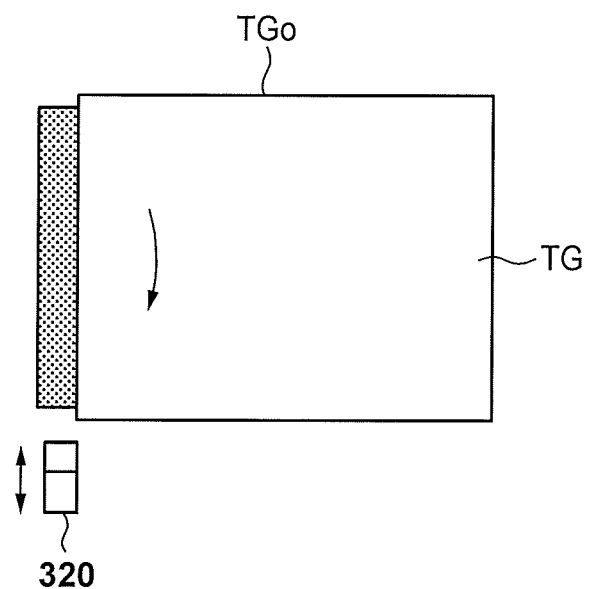
FIG. 9E is a view for explaining control of the position where the arc discharge is generated in the deposition apparatus shown in FIG. 3.

After the arc spot AS is generated circumferentially on the outer surface $TG_o$ of the target TG, the target driving unit 312 (moving unit 324) moves the target TG along the rotating axis RA as shown in FIG. 9D. At this time, the target TG is moved such that the circumferential arc spot AS generated in the target TG by the preceding arc discharges and an arc spot to be generated in the target TG by the succeeding arc discharge are adjacent to each other or parts thereof overlap with each other. Then, as described above, the striker 320 is driven by the striker driving unit 326 and moved closer to the outer surface $TG_o$ of the target TG, thereby generating an arc discharge. After the completion of the arc discharge, the striker driving unit 326 drives the striker 320, setting the striker 320 and the outer surface $TG_o$ of the target TG in the separating state. By repeating this, the arc spot AS is further generated circumferentially on the outer surface $TG_o$ of the target TG as shown in FIG. 9E.

As described above, in this embodiment, rotation and movement of the target TG are controlled so as to change the facing position on the outer surface $TG_o$ of the target TG facing the striker 320. This makes it possible to bring the striker 320 closer to (into contact with) the entire surface of the outer surface TGO of the target TG and to improve the utilization efficiency of the target TG without shaving the target TG. In this embodiment, it is also possible to achieve miniaturization of an apparatus and a reduction in a maintenance cost because grinder or the like which shaves the target TG is not needed.

In this embodiment, both rotation and movement of the target TG are controlled so as to change the facing position on the outer surface $TG_o$ of the target TG facing the striker 320. However, the facing position on the outer surface $TG_o$ of the target TG facing the striker 320 may be changed by controlling only rotation of the target TG or only movement of the target TG.

In this embodiment, rotation and movement of the target TG are controlled such that the target TG moves along the rotating axis RA after the target TG rotates once about the rotating axis RA. However, the present invention is not limited to this. Rotation and movement of the target TG may be controlled such that, for example, the arc spot AS is generated spirally, that is, a locus on the outer surface $TG_o$ of the target TG is formed into a spiral shape.

In this embodiment, the facing position on the outer surface $TG_o$ of the target TG facing the striker 320 is changed each time an arc discharge is generated. However, the facing position may be changed not each time the arc discharge is generated but each time the size of the arc spot AS generated in the target TG becomes larger than a predetermined size. In other words, the same facing position may be maintained without any change until the size of the arc spot AS generated in the target TG becomes larger than the predetermined size.

It is known that a deposition rate of a film formed on each substrate 1 varies in accordance with a position of the arc spot AS generated by the arc discharge. More specifically, the deposition rate increases when the arc spot AS exists in the center of the anode 316 and the deposition rate decreases when the arc spot AS approaches the anode 316. It is therefore preferable that the arc spot AS is generated at a position away from the anode 316. To achieve this, in this embodiment, the striker driving unit 326 drives the striker 320 such that the distance between the anode 316 and the striker 320 in the close state becomes constant. Consequently, the arc spot AS is always generated at the position away from the anode 316, making it possible to stabilize the deposition rate.

The preferred embodiment of the present invention has been described above. However, the present invention is not limited to this embodiment, and various changes and modifications can be made within the spirit and scope of the present invention.

The invention claimed is:

1. A deposition apparatus which forms a film on a substrate, comprising:
    a rotation unit configured to rotate a target about a rotating axis;
    a moving unit configured to move the target along the rotating axis;
    a striker configured to generate an arc discharge;
    a driving unit configured to drive the striker so as to make a close state which the striker closes to a side surface around the rotating axis of the target to generate the arc discharge; and
    a control unit configured to control rotation of the target by the rotation unit and movement of the target by the moving unit so as to change a facing position on the side surface of the target facing the striker in the close state.

2. The deposition apparatus according to claim 1, wherein the control unit controls the rotation of the target by the rotation unit and the movement of the target by the moving unit such that the target moves along the rotating axis after the target rotates once about the rotating axis.

3. The deposition apparatus according to claim 1, wherein the control unit controls the rotation of the target by the rotation unit and the movement of the target by the moving unit such that a locus on the side surface of the target at the facing position is formed into a spiral shape.

4. The deposition apparatus according to claim 1, wherein the control unit changes the facing position each time the arc discharge is generated.

5. The deposition apparatus according to claim 1, wherein the control unit changes the facing position each time a size of an arc spot generated in the target by the arc discharge becomes larger than a predetermined size.

6. The deposition apparatus according to claim 1, wherein the control unit changes the facing position such that a part of the arc spot generated in the target by the arc discharge overlaps.

7. The deposition apparatus according to claim 1, further comprising an anode arranged to face the target,
   wherein the driving unit drives the striker such that a distance between the anode and the striker in the close state becomes constant.

8. The deposition apparatus according to claim 1, wherein the target has one of a columnar shape, a prismatic shape, a cylindrical shape, and a rectangular tube shape.

* * * * *